US012785682B2

(12) United States Patent
Foley et al.

(10) Patent No.: US 12,785,682 B2
(45) Date of Patent: Nov. 3, 2026

(54) MULTI-STAGE DRIVER CIRCUIT AND METHOD OF DISTRIBUTED DRIVER RESPONSE SHAPING USING PROGRAMMABLE CAPACITORS

(71) Applicant: MACOM Technology Solutions Holdings, Inc., Lowell, MA (US)

(72) Inventors: David Foley, Valbonne (FR); Merrick Brownlee, Hillsboro, OR (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 41 days.

(21) Appl. No.: 18/313,952

(22) Filed: May 8, 2023

(65) Prior Publication Data

US 2024/0039530 A1 Feb. 1, 2024

Related U.S. Application Data

(60) Provisional application No. 63/369,543, filed on Jul. 27, 2022.

(51) Int. Cl.
*H03F 1/56* (2006.01)
*H03K 17/06* (2006.01)
(Continued)

(52) U.S. Cl.
CPC ............. *H03K 17/693* (2013.01); *H03F 1/56* (2013.01); *H03K 17/063* (2013.01); *H03K 19/018507* (2013.01)

(58) Field of Classification Search
None
See application file for complete search history.

(56) References Cited

U.S. PATENT DOCUMENTS 3,661,443 A 5/1972 Harris et al.
4,534,064 A 8/1985 Giacometti et al.
(Continued)

FOREIGN PATENT DOCUMENTS

EP 0606161 A2 7/1994
EP 1471671 A2 10/2004
(Continued)

OTHER PUBLICATIONS

Zhang, Tao, et al., "10-GB/s Distributed Amplifier-Based VCSEL Driver IC With ESD Protection in 130-nm CMOS", IEEE Transactions on Very Large Scale Integration Systems, vol. 24 Issue 7, Jan. 7, 2016, pp. 2502-2510.
(Continued)

*Primary Examiner* — Thomas J. Hiltunen
(74) *Attorney, Agent, or Firm* — Robert D. Atkins; PATENT LAW GROUP: Atkins and Associates, P.C.

(57) ABSTRACT

A multi-stage driver circuit has a transmission line coupled to an output of the multi-stage driver circuit. The transmission line has inductive elements and programmable capacitive elements selected to shape the transmitted data signal. The programmable capacitive elements have a first capacitor with a first terminal coupled to a first power supply conductor, and a first transistor with a first conduction terminal coupled to a second terminal of the first capacitor, and a second conduction terminal coupled to a second power supply conductor. The programmable capacitive elements have a register with a first output coupled to a control terminal of the first transistor. The programmable capacitive elements are selected to shape the transmitted data signal by observing operational dynamics of the multi-stage driver circuit.

19 Claims, 5 Drawing Sheets

(51) Int. Cl.
*H03K 17/693* (2006.01)
*H03K 19/0185* (2006.01)

(56) References Cited

U.S. PATENT DOCUMENTS 4,545,078 A 10/1985 Wiedeburg
4,687,924 A 8/1987 Galvin et al.
4,709,416 A 11/1987 Patterson
4,734,914 A 3/1988 Yoshikawa
4,747,091 A 5/1988 Doi
4,772,859 A 9/1988 Sakai
4,864,649 A 9/1989 Tajima et al.
5,019,769 A 5/1991 Levinson
5,039,194 A 8/1991 Block et al.
5,047,835 A 9/1991 Chang
5,057,932 A 10/1991 Lang
5,177,381 A * 1/1993 Friesen .................. H03G 7/001 330/277
5,289,302 A 2/1994 Eda
5,334,826 A 8/1994 Sato et al.
5,355,422 A 10/1994 Sullivan et al.
5,361,038 A 11/1994 Allen et al.
5,383,046 A 1/1995 Tomofuji et al.
5,383,208 A 1/1995 Queniat et al.
5,392,273 A 2/1995 Masaki et al.
5,394,416 A 2/1995 Ries
5,396,059 A 3/1995 Yeates
5,448,629 A 9/1995 Bosch et al.
5,471,501 A 11/1995 Parr et al.
5,488,627 A 1/1996 Hardin et al.
5,491,548 A 2/1996 Bell et al.
5,510,924 A 4/1996 Terui et al.
5,532,471 A 7/1996 Khorramabadi et al.
5,550,513 A 8/1996 Wong
5,557,437 A 9/1996 Sakai et al.
5,574,435 A 11/1996 Mochizuki
5,636,254 A 6/1997 Hase et al.
5,673,282 A 9/1997 Wurst
5,710,660 A 1/1998 Yamamoto et al.
5,796,501 A 8/1998 Sotom et al.
5,812,572 A 9/1998 King et al.
5,822,099 A 10/1998 Takamatsu
5,844,928 A 12/1998 Shastri et al.
5,880,640 A 3/1999 Dueme
5,900,959 A 5/1999 Noda et al.
5,926,303 A 7/1999 Giebel et al.
5,943,152 A 8/1999 Mizrahi et al.
5,953,690 A 9/1999 Lemon et al.
5,956,168 A 9/1999 Levinson et al.
5,978,393 A 11/1999 Feldman et al.
6,010,538 A 1/2000 Sun et al.
6,014,241 A 1/2000 Winter et al.
6,020,593 A 2/2000 Chow et al.
6,021,947 A 2/2000 Swartz
6,023,147 A 2/2000 Cargin, Jr. et al.
6,049,413 A 4/2000 Taylor et al.
6,055,252 A 4/2000 Zhang
6,064,258 A 5/2000 Shulman
6,064,501 A 5/2000 Roberts et al.
6,081,362 A 6/2000 Hatakeyama et al.
6,108,113 A 8/2000 Fee
6,111,687 A 8/2000 Tammela
6,115,113 A 9/2000 Flockencier
H1881 H 10/2000 Davis et al.
6,160,647 A 12/2000 Gilliland et al.
6,175,434 B1 1/2001 Feng
6,259,293 B1 7/2001 Hayase et al.
6,262,781 B1 7/2001 Deter
6,282,017 B1 8/2001 Kinoshita
6,292,497 B1 9/2001 Nakano
6,333,895 B1 12/2001 Hamamoto et al.
6,366,373 B1 4/2002 MacKinnon et al.
6,388,784 B1 5/2002 Nakamura et al.
6,397,090 B1 5/2002 Cho
6,423,963 B1 7/2002 Wu
6,452,719 B2 9/2002 Kinoshita
6,473,224 B2 10/2002 Dugan et al.
6,494,370 B1 12/2002 Sanchez
6,512,617 B1 1/2003 Tanji et al.
6,535,187 B1 3/2003 Wood
6,556,601 B2 4/2003 Nagata
6,570,944 B2 5/2003 Best et al.
6,580,328 B2 6/2003 Tan et al.
6,657,488 B1 12/2003 King et al.
6,661,940 B2 12/2003 Kim et al.
6,704,008 B2 3/2004 Naito et al.
6,707,600 B1 3/2004 Dijaili et al.
6,720,826 B2 4/2004 Yoon
6,738,578 B1 5/2004 Mihota
6,740,864 B1 5/2004 Dries
6,759,907 B2 7/2004 Orr et al.
6,798,281 B2 9/2004 Dueme et al.
6,801,555 B1 10/2004 DiJaili et al.
6,828,857 B2 12/2004 Paillet et al.
6,836,185 B1 12/2004 Pobanz
6,836,493 B2 12/2004 Mahowald et al.
6,837,625 B2 1/2005 Schott et al.
6,852,966 B1 2/2005 Douma et al.
6,862,047 B2 3/2005 Hibi
6,864,751 B1 3/2005 Schmidt et al.
6,868,104 B2 3/2005 Stewart et al.
6,879,217 B2 4/2005 Visocchi
6,888,123 B2 5/2005 Douma et al.
6,909,731 B2 6/2005 Lu
6,934,307 B2 8/2005 DeCusatis et al.
6,934,479 B2 8/2005 Sakamoto et al.
6,941,077 B2 9/2005 Aronson et al.
6,952,531 B2 10/2005 Aronson et al.
6,956,643 B2 10/2005 Farr et al.
6,957,021 B2 10/2005 Aronson et al.
6,967,320 B2 11/2005 Chieng et al.
7,005,901 B1 2/2006 Jiang et al.
7,031,574 B2 4/2006 Huang et al.
7,039,082 B2 5/2006 Stewart et al.
7,046,721 B2 5/2006 Grohn
7,049,759 B2 5/2006 Roach
7,050,720 B2 5/2006 Aronson et al.
7,058,310 B2 6/2006 Aronson et al.
7,066,746 B1 6/2006 Togami et al.
7,079,775 B2 7/2006 Aronson et al.
7,127,391 B2 10/2006 Chang et al.
7,145,928 B1 12/2006 Maxim et al.
7,184,671 B2 2/2007 Wang
7,193,957 B2 3/2007 Masui et al.
7,206,023 B2 4/2007 Belliveau
7,215,891 B1 5/2007 Chiang et al.
7,233,206 B2 6/2007 Murakami et al.
7,265,334 B2 9/2007 Draper et al.
7,269,194 B2 9/2007 Diaz et al.
7,276,682 B2 10/2007 Draper et al.
7,286,726 B1 10/2007 Keil
7,315,206 B2 * 1/2008 Leyten .................... H03F 3/605 330/53
7,357,513 B2 4/2008 Watson et al.
7,381,935 B2 6/2008 Sada et al.
7,403,064 B2 7/2008 Chou et al.
7,453,475 B2 11/2008 Nitta et al.
7,504,610 B2 3/2009 Draper
7,505,497 B2 3/2009 Xu et al.
7,692,417 B2 4/2010 Dagher
7,741,908 B2 6/2010 Furuta
7,804,357 B2 9/2010 Shigematsu
8,094,692 B2 1/2012 Nakamura et al.
8,274,335 B1 9/2012 Chatwin
8,508,296 B1 * 8/2013 Mustafa .................. H03F 1/565 330/124 R
8,576,010 B2 * 11/2013 Yanduru ............... H03F 1/0288 330/124 R
8,704,575 B2 * 4/2014 Hur ........................ H03H 11/16 327/233
8,824,982 B2 * 9/2014 Suh ........................ H01Q 23/00 455/193.1
8,837,542 B1 9/2014 Yang et al.
9,065,407 B2 6/2015 Zou et al.

(56) References Cited

U.S. PATENT DOCUMENTS

| | | | | |
|---|---|---|---|---|
| 9,088,122 | B2 | 7/2015 | Moto | |
| 9,143,172 | B2 * | 9/2015 | See | H03F 3/24 |
| 9,151,604 | B1 | 10/2015 | Dunne | |
| 9,419,410 | B2 | 8/2016 | Usuki | |
| 9,614,485 | B2 * | 4/2017 | Sato | H03F 3/605 |
| 9,698,023 | B2 | 7/2017 | Itabashi et al. | |
| 9,754,546 | B2 * | 9/2017 | Kim | G09G 3/3648 |
| 10,243,533 | B1 * | 3/2019 | Berkhout | H03G 3/005 |
| 10,263,573 | B2 | 4/2019 | Bazzani et al. | |
| 10,423,884 | B2 * | 9/2019 | Hyde | G06N 7/01 |
| 2001/0046243 | A1 | 11/2001 | Schie | |
| 2002/0015305 | A1 | 2/2002 | Bornhorst et al. | |
| 2002/0085600 | A1 | 7/2002 | Jung | |
| 2002/0097467 | A1 | 7/2002 | Terahara et al. | |
| 2002/0105982 | A1 | 8/2002 | Chin et al. | |
| 2002/0130977 | A1 | 9/2002 | Hibi | |
| 2002/0140378 | A1 | 10/2002 | Volk et al. | |
| 2002/0181823 | A1 | 12/2002 | Ibukuro | |
| 2003/0030756 | A1 | 2/2003 | Kane et al. | |
| 2003/0043869 | A1 | 3/2003 | Vaughan | |
| 2003/0053003 | A1 | 3/2003 | Nishi et al. | |
| 2003/0067662 | A1 | 4/2003 | Brewer et al. | |
| 2003/0112075 | A1 | 6/2003 | Betti-Berutto et al. | |
| 2003/0122057 | A1 | 7/2003 | Han et al. | |
| 2003/0151396 | A1 | 8/2003 | Self et al. | |
| 2004/0032890 | A1 | 2/2004 | Murata | |
| 2004/0047635 | A1 | 3/2004 | Aronson et al. | |
| 2004/0091005 | A1 | 5/2004 | Hofmeister et al. | |
| 2004/0095976 | A1 | 5/2004 | Bowler et al. | |
| 2004/0101007 | A1 | 5/2004 | Bozso et al. | |
| 2004/0114650 | A1 | 6/2004 | Tanaka et al. | |
| 2004/0136727 | A1 | 7/2004 | Androni et al. | |
| 2004/0160996 | A1 | 8/2004 | Giorgi et al. | |
| 2004/0208526 | A1 | 10/2004 | Mibu | |
| 2004/0240041 | A1 | 12/2004 | Tian et al. | |
| 2005/0024023 | A1 | 2/2005 | Chang | |
| 2005/0024142 | A1 | 2/2005 | Sowlati | |
| 2005/0062530 | A1 | 3/2005 | Bardsley et al. | |
| 2005/0147136 | A1 | 7/2005 | Pobanz | |
| 2005/0180280 | A1 | 8/2005 | Hoshino et al. | |
| 2005/0185149 | A1 | 8/2005 | Lurkens et al. | |
| 2005/0215090 | A1 | 9/2005 | Harwood | |
| 2005/0243879 | A1 | 11/2005 | Horiuchi et al. | |
| 2005/0265709 | A1 | 12/2005 | Kim et al. | |
| 2006/0114954 | A1 | 6/2006 | Wong et al. | |
| 2006/0125557 | A1 | 6/2006 | Manstretta | |
| 2006/0192899 | A1 | 8/2006 | Ogita | |
| 2006/0239308 | A1 | 10/2006 | Husain et al. | |
| 2006/0261893 | A1 | 11/2006 | Chiang | |
| 2006/0280211 | A1 | 12/2006 | Garez | |
| 2007/0058089 | A1 | 3/2007 | Wang | |
| 2007/0081130 | A1 | 4/2007 | May et al. | |
| 2007/0098026 | A1 | 5/2007 | Uesaka et al. | |
| 2007/0159434 | A1 | 7/2007 | Yen et al. | |
| 2007/0195208 | A1 | 8/2007 | Miyazawa et al. | |
| 2007/0202215 | A1 | 8/2007 | Lak | |
| 2007/0229718 | A1 | 10/2007 | Hall, Jr. | |
| 2007/0263685 | A1 | 11/2007 | Takasou et al. | |
| 2007/0286609 | A1 | 12/2007 | Ikram et al. | |
| 2008/0012508 | A1 | 1/2008 | Steele et al. | |
| 2008/0024469 | A1 | 1/2008 | Damera-Venkata et al. | |
| 2008/0055005 | A1 | 3/2008 | Nam et al. | |
| 2008/0068066 | A1 | 3/2008 | Mittal | |
| 2008/0074562 | A1 | 3/2008 | Endo et al. | |
| 2008/0231209 | A1 | 9/2008 | Shiwaya et al. | |
| 2008/0246893 | A1 | 10/2008 | Boss et al. | |
| 2008/0303499 | A1 | 12/2008 | Chen et al. | |
| 2008/0309407 | A1 | 12/2008 | Nakamura et al. | |
| 2009/0148094 | A1 | 6/2009 | Kucharski et al. | |
| 2009/0238226 | A1 | 9/2009 | Moto et al. | |
| 2009/0243717 | A1 | 10/2009 | Bonthron | |
| 2009/0268767 | A1 | 10/2009 | Nelson | |
| 2010/0102884 | A1 | 4/2010 | Takaso | |
| 2010/0164396 | A1 | 7/2010 | Lindeberg et al. | |
| 2010/0172384 | A1 | 7/2010 | Groepl | |
| 2010/0183318 | A1 | 7/2010 | Tanaka | |
| 2011/0062874 | A1 | 3/2011 | Knapp | |
| 2011/0069960 | A1 | 3/2011 | Knapp et al. | |
| 2011/0147596 | A1 | 6/2011 | Ishida et al. | |
| 2011/0227648 | A1 | 9/2011 | Mohammadi et al. | |
| 2011/0227649 | A1 | 9/2011 | Montalvo | |
| 2011/0269416 | A1 * | 11/2011 | Kadoi | H04B 1/0458<br>455/127.1 |
| 2012/0201260 | A1 | 8/2012 | Nguyen et al. | |
| 2012/0299660 | A1 | 11/2012 | Arkiszewski et al. | |
| 2013/0050289 | A1 | 2/2013 | Kang et al. | |
| 2013/0070796 | A1 | 3/2013 | Belloni et al. | |
| 2013/0229699 | A1 | 9/2013 | Tatsumi et al. | |
| 2014/0023374 | A1 | 1/2014 | Yuda | |
| 2014/0118083 | A1 * | 5/2014 | Shastry | H03H 11/0466<br>333/129 |
| 2014/0226147 | A1 | 8/2014 | Metzler | |
| 2014/0233594 | A1 | 8/2014 | Kubo | |
| 2014/0320212 | A1 | 10/2014 | Kalantari et al. | |
| 2015/0229408 | A1 | 8/2015 | Ding et al. | |
| 2015/0295547 | A1 | 10/2015 | Blednov | |
| 2016/0065149 | A1 | 3/2016 | Shaw | |
| 2016/0070123 | A1 | 3/2016 | Tatsumi | |
| 2016/0072462 | A1 | 3/2016 | Itabashi et al. | |
| 2017/0054510 | A1 | 2/2017 | Zortea et al. | |
| 2017/0371363 | A1 | 12/2017 | Habu et al. | |
| 2018/0062589 | A1 * | 3/2018 | Bazzani | H04B 10/693 |
| 2022/0103135 | A1 | 3/2022 | Ismail et al. | |
| 2023/0006625 | A1 | 1/2023 | Jo et al. | |
| 2023/0194631 | A1 * | 6/2023 | Menzel | G01R 31/64<br>324/548 |

FOREIGN PATENT DOCUMENTS

| | | | |
|---|---|---|---|
| EP | 2249492 | B1 | 1/2014 |
| JP | 58140175 | | 8/1983 |
| JP | 62124576 | | 6/1987 |
| JP | 62235975 | | 10/1987 |
| JP | 62281485 | | 12/1987 |
| JP | 2001119250 | A | 4/2001 |
| JP | 2004045989 | | 2/2004 |
| JP | 2015152660 | A | 8/2015 |
| WO | 9321706 | A1 | 10/1993 |
| WO | 2004098100 | A2 | 11/2004 |
| WO | 02063800 | A1 | 8/2005 |
| WO | 2021117083 | A1 | 6/2021 |

OTHER PUBLICATIONS

Single-Ended vs. Differential Methods of Driving a Laser Diode, Maxim Integrated TM, Application Note: HFAN-2.5.0, Rev. 5; Oct. 2008, 5 pages.

Miller Effect—Wikipedia, the free encyclopedia, http://en.wikipedia.org/wiki/Miller effect, Mar. 9, 2015.

Yuan, 2007, Springer, XVIII, pp. 20-21.

Analog Devices, Background information about wireless conuuunications. Date unknown, http://rf.rfglobalnet.com/library/applicationnotes/files/7/bginfo.htm, 8 pages.

A Low Noise, Wide Dynamic Range, Transimpedance Amplifier with Automatic Gain Control for SDH/SONET (STM16/0C48) in a 30GHz ft BiCMOS Process, Mihai A. T., Sanduleanu, Philips Research Eindhoven, Paul Manteman, Philips Semiconductors Nijmegen, Sep. 19, 2001, 19 pages.

"PLL Design", http://members.innet.net.au/~richardh/PPH.htm, 9 pages.

"LCT3454-IA Synchronous Buck-Boost High Current LED Driver" Linear Technology, http://www.linear.com/product/LTC3454 @Linear Technology, 12 pages.

Garth Nash, "AN535 Application Notes—Phase-Locked Loop Design Fundamentals", Motorola, Inc, 1994, 3 pages.

Jamie Bailey "How DVD Works", http://sweb.uky.edu/~irbai10lldvd.htm, May I, 1999, pp. 1-6.

Tuan "Solace" Nguyen, "CD, CD-R, CD-RW, DVD, DD-RAM, DVD-RW, and MO", Tweak3D.Net-YourFreakin' Tweakin Source!, http://www.tweak3d.net/articles/opticals/, May 13, 2000, 7 pages.

(56) References Cited

OTHER PUBLICATIONS

"An Introduction to DVD-RW", DVD White Paper, Pioneer New Media Technologies, Inc., Feb. 8, 2001, 8 pages.
Ron Bertrand, "The Basics of PLL Frequency Synthesis", Online Radio & Electronics Course, Apr. 2002, 9 pages.
Richard Wilkinson "Topic: Selecting the Right DVD Mastering Technique", DVD Technology Update, http://www.opticaldisccom/dvdupdate.htrnl, 2002, 8 pages.
Dr. John Rilum, "Mastering Beyond DVD Density", http://www.optical-disc.com/beyonddvd.htrnl, 2002, 7 pages.
"CD Basics: The Bumps", Howstuffworks "How CD Burners Work", http://entertainment.howstuffworks.com/cd-burner1.htm, 2004, 3 pages.
Keith Szolusha, "Linear Technology Design Notes DC/DC Converter Drives Lumileds White LEDs from a Variety of Power Sources—Design Note 340", Linear Technology Corporation, 201 Linear Technology Corporation 2004, date unknown, 2 pages.
"An Introduction to DVD Recordable (DVD-R) What is DVD Recordable?" http://www.dvdcopy.com/reference/dvd recordable.html, 2004, 8 pages.
"Power Management, LED-driver considerations" Analog and Mixed-Signal Products, Analog Applications Journal, www.ti.com/sc/analogapps, Texas Instruments Incorporated, © 2005 Texas Instruments Incorporated, Michael Day, 5 pages.
"Linear Technology LCT 3533 2A Wide Input Voltage Synchronous Buck-Boost DC/DC Converter", ©Linear Technology Corporation 2007, 16 pages.
"National Semiconductor LM 3549 High Power Sequential LED Driver", © 2010 National Semiconductor Corporation, www.national.com, Aug. 3, 2010, 20 pages.
"TPS63020 TPS63021 High Efficiency Single Inductor Buck-Boost Converter With 4-A Switches", Texas Instruments, Copyright © 2010, Texas Instruments Incorporated, Apr. 2010, 28 pages.
"LT3476-High Current Quad Output LED Driver" Linear Technology, http://www.linear.com/nroduct/LT3476, @2010 Linear Technology, 14 pages.
"Current mirror" Wikipedia the free encyclopedia http://en.wikipedia.org/wiki/Current mirror, May 22, 2011, 8 pages.
"Mosfet" Wikipedia the free encyclopedia http://en.wikipedia.org/wiki/MOSFET May 27, 2011, 24 pages.
Abhijit Phanse, National Semiconductor, "Exercise 2: Define the time variance of a fiber optic channel's Impulse Response, and suggest a method for measuring it", IEEE 802.3ae, 11/00, 13 pages.

* cited by examiner

*-Prior Art -*

MULTI-STAGE DRIVER CIRCUIT AND METHOD OF DISTRIBUTED DRIVER RESPONSE SHAPING USING PROGRAMMABLE CAPACITORS

CLAIM OF DOMESTIC PRIORITY

The present application claims the benefit of U.S. Provisional Application No. 63/369,543, filed Jul. 27, 2022, which application is incorporated herein by reference.

FIELD OF THE INVENTION

The present invention relates in general to electrical devices and, more particularly, to a multi-stage driver circuit and method of distributed driver response shaping using programmable capacitors.

BACKGROUND

Semiconductor and electrical devices are commonly found in modern electrical products. Electrical devices vary in the number and density of electrical components. Electrical devices perform a wide range of functions, such as signal processing, driving signal propagation, filtering, high-speed calculations, signal amplification, transmitting and receiving electrical signals, and controlling electrical devices. Electrical devices are found in the fields of automotive, communications, power conversion, networks, computers, and consumer products. Electrical devices are also found in military applications, aerospace, aviation, automotive, industrial controllers, and office equipment. A driver circuit is commonly used to transmit an electrical signal between two points or devices. The driver circuit should be properly tuned and calibrated to minimize transmission loss, return-loss, reflections, and other signal degradations, while maximizing bandwidth, transmission rate, and signal integrity.

A block diagram illustrating a conventional lumped driver is shown in FIG. 1. Amplifier 100 is a lumped stage driver with termination resistors 102 and 104 coupled to power supply conductor 106, operating at a positive voltage, and outputs 107 and 108. The bandwidth (BW) of the lumped driver, comprising a single stage, is dictated by the termination resistance (RT) 102 and 104, and the loading capacitance from the lumped stages. The lumped stage, and hence loading capacitance, can be quite large because of the large current required in the stage. The large current dictates the use of e.g., large MOSFET devices in the stage for a CMOS process. The large capacitance, from the driver stage devices and the associated routing parasitics, can be very restrictive and the benefit of moving to a distributed approach is that the parasitic loading is now reduced by the chosen number of stages.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
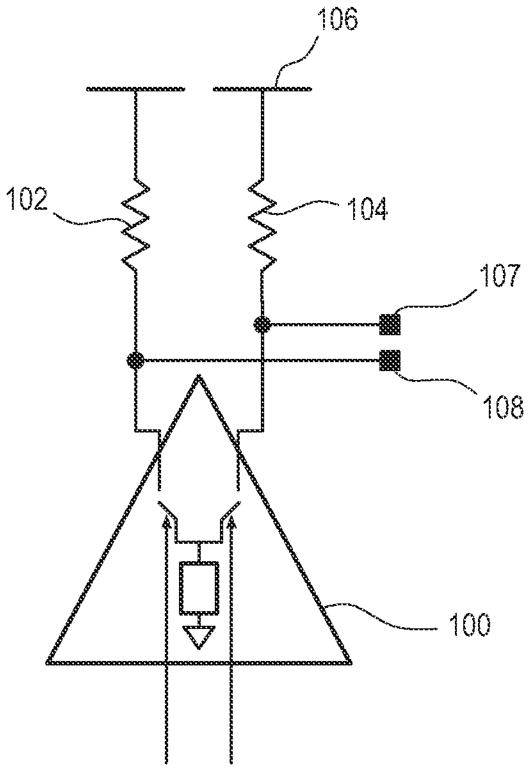
FIG. 1 illustrates a block diagram of a conventional lumped driver.
Figure 2:
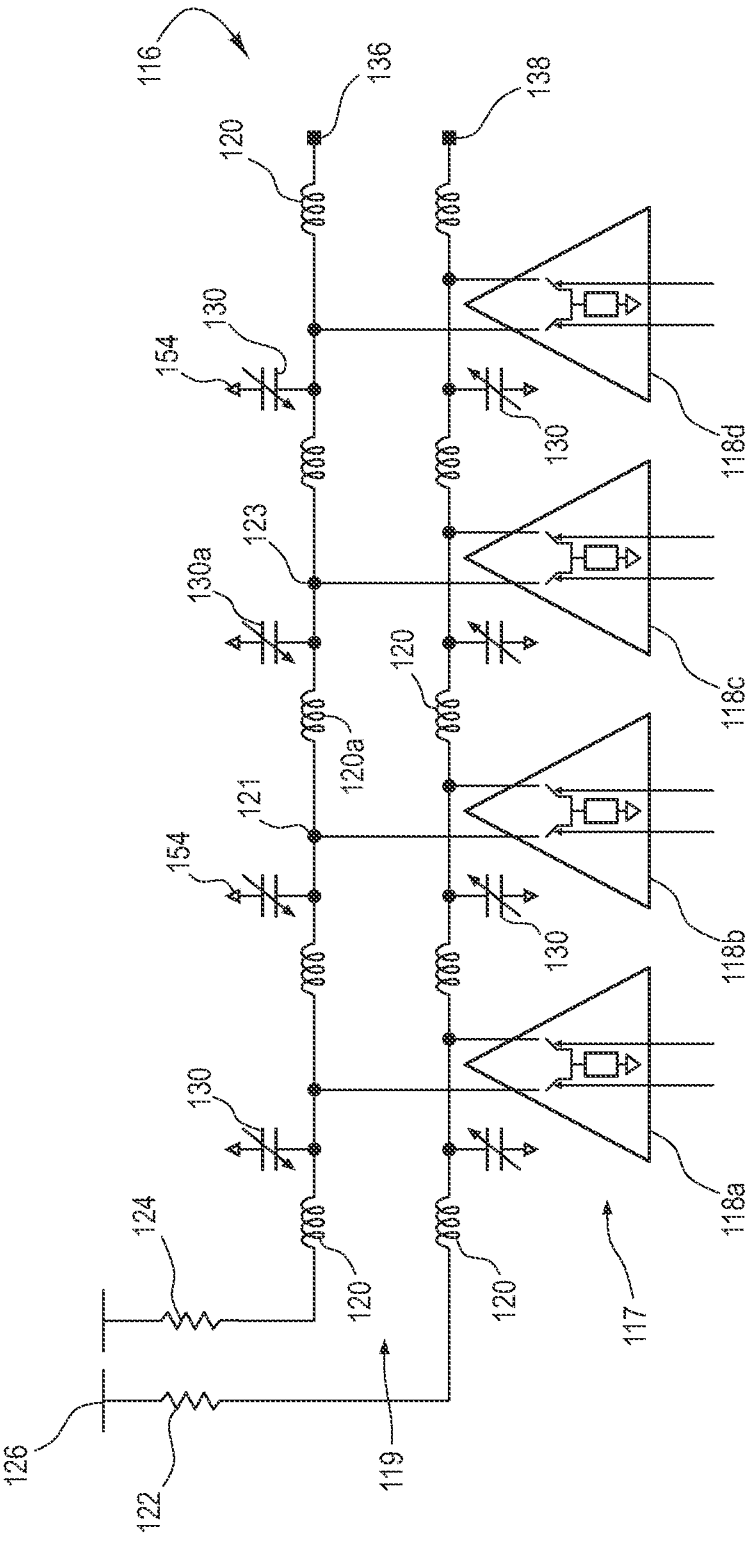
FIG. 2 illustrates a block diagram of a distributed driver architecture with selectable capacitors to shape the transmitted signal.

An exemplary 4-stage distributed driver architecture 116 is shown in FIG. 2. Distributed driver architecture 116 is chosen to address bandwidth and return-loss limitations of a conventional lumped driver approach, as described in FIG. 1. The number of stages is chosen to meet BW, power, and complexity concerns. For this example, each of the four stages of distributed amplifier 117, shown as amplifiers **118*a*-118*d***, would carry a quarter of the load current of the equivalent lumped stage.

The distributed driver incorporates input and output inductor-capacitor (LC) transmission lines. The inductive features of transmission line 119 are represented by inductive elements 120. Each inductive element 120 is coupled between two nodes of transmission line 119. For example, inductive element **120*a* is coupled between node 121 and node 123 of transmission line 119. The capacitive features of transmission line 119 are represented by capacitive elements 130. In particular, all capacitors 130 are selectable or programmable capacitors to shape to the data signal waveform. All programmable capacitors 130 are coupled to a node of transmission line 119 and referenced to power supply conductor 154. For example, programmable capacitor 130*a* is coupled between node 123 and power supply conductor 154 operating at ground potential. The output of distributed driver architecture 116 is terminals 136 and 138**.

The transmission line L and C components are chosen to meet both impedance and delay requirements, thereby minimizing reflections from impedance mismatch, and ensuring in-phase addition of the distributed output stages. The impedance requirement is defined in equation (1) and the delay is defined in equation (2). The L and C product in equation (3) must also be chosen small enough so that the line approximates ideal behavior over the desired bandwidth.

$$Z=(L/C)^{1/2} \tag{1}$$

$$\mathrm{Tau}=(L*C)^{1/2} \tag{2}$$

$$\text{Cutoff Frequency}=1/(\pi*(L/C)^{1/2}) \tag{3}$$

The driver output impedance of termination resistors (RT) 122 and 124 requirement can be restricted to values such as 25Ω and 50Ω depending on the final application e.g., a DML or EML laser driver. RT 122 and 124 are coupled to power supply conductor 126 operating at a positive voltage. Each segment of the output transmission line must ideally have an impedance (1) that matches that of the output impedance (RT). If this is not the case, then reflections will be evident on the driver response. The reflection can subtract from, or add to, a response of the driver depending on whether the impedance of the segment is above or below the target impedance. The reflection coefficient is defined in equation (4), where ZL is the load impedance and Z is the line segment impedance.

$$P=(ZL-Z)/(ZL+Z) \quad (4)$$

Figure 3:
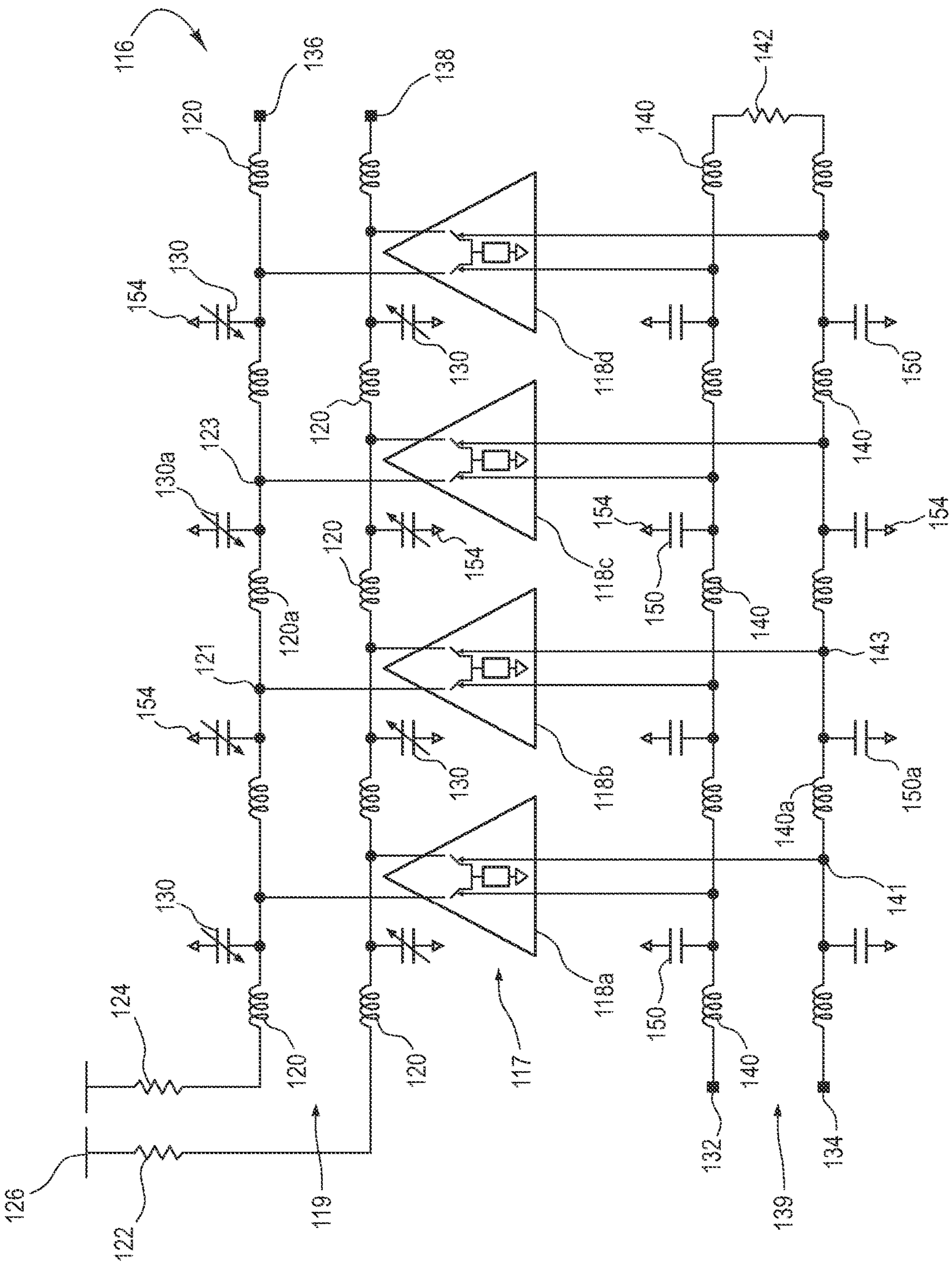
FIG. 3 illustrates an expanded block diagram of a distributed driver architecture with selectable capacitors to shape the transmitted signal.

In FIG. 3, transmission line 119 functions as described in FIG. 2. FIG. 3 further shows the input of distributed driver architecture 116, including input signal at terminals 132 and 134, transmission line 139 represented by inductive elements 140 and capacitive elements 150, and termination resistor 142. For example, inductive element 140*a* is coupled between node 141 and node 143 of transmission line 119. Capacitor 150*a* is coupled between node 143 and power supply conductor 154 operating at ground potential. The multi-stage distributed amplifier 117, comprising amplifiers 118*a*-118*d*, is coupled between transmission line 119 and transmission line 139.

The driver response is the combination of a normal response (without any reflections) and the reflection component as dictated by the reflection coefficient multiplied by the normal response. The timing of this reflection perturbation is also impacted by the mismatched segment location in the transmission line.

The reflection perturbation can shape the response of the output driver. This offers the advantage of adjusting the driver response and this approach could also be used to filter out undesired reflections that arise from the driver integration on the end application. The application may include the integration of the driver with a channel media (such as PCB traces) and non-ideal loading, such as directly modulated laser diode (DML) or electro-absorption modulated laser (EML) loads. The channel media and the loading may not ideally match the output driver impedance. This would result in reflections that degrade the driver response. The impact of these undesired reflections can be attenuated by employing the programmable distributed driver segment impedance.

Figure 4:
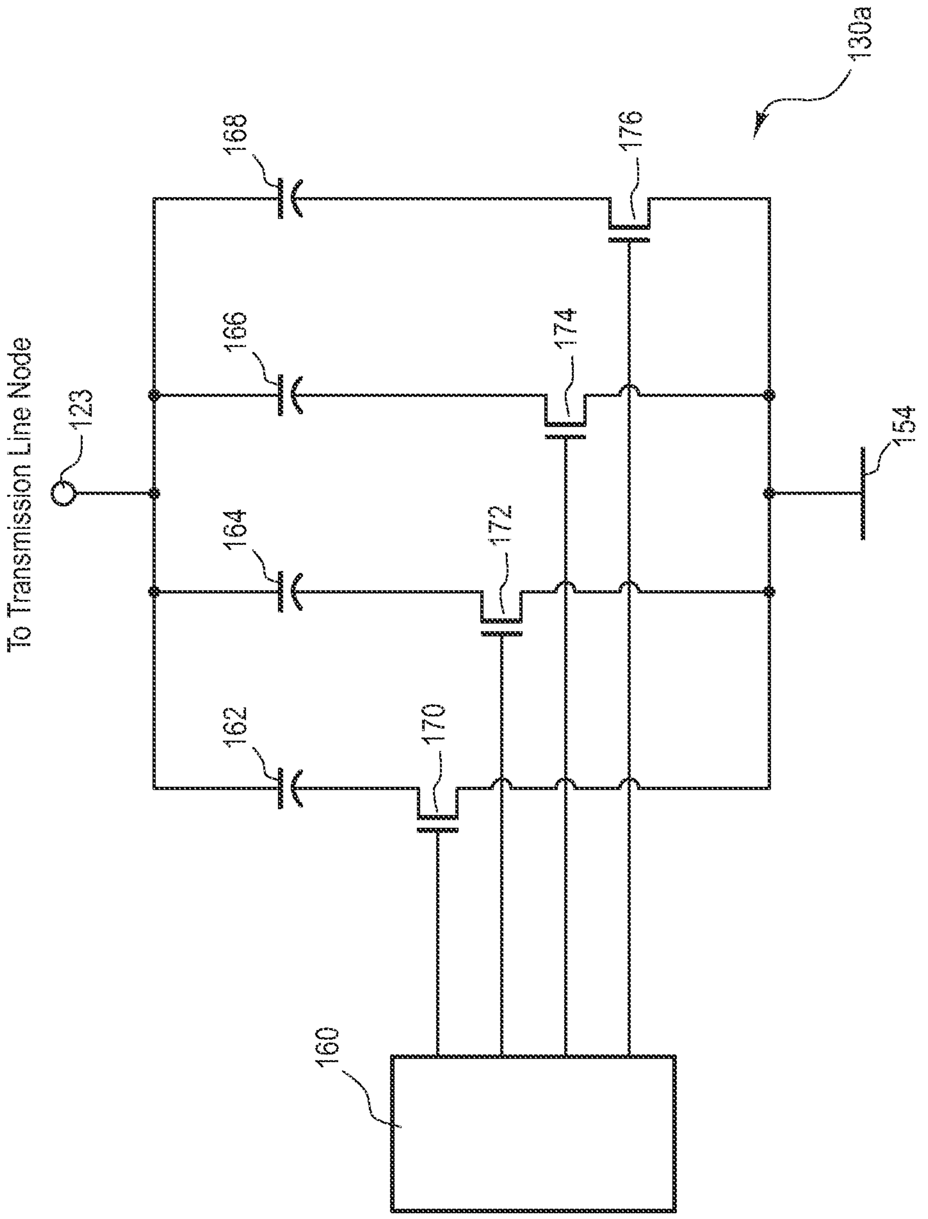
FIG. 4 illustrates a selectable capacitor bank with a register to store the selected value.

The segment impedance can be adjusted through, e.g., selectable or programmable capacitance loading. Each stage capacitor 130 can be selected or programmed individually. FIG. 4 illustrates one embodiment of programmable capacitor 130 with resistor or memory 160 capable of storing logic states or voltages. In this case, capacitor 130 is a programmable capacitor bank. A first terminal of capacitors 162, 164, 166, and 168 are coupled to the respective node of the transmission line. For example, capacitor bank 130*a* is coupled to node 144. A second terminal of capacitors 162-168 is coupled to the drains of transistors 170, 172, 174, and 176, respectively. The sources of transistors 170-176 are coupled to power supply conductor 154. Register 160 has four outputs respectively coupled to the gates of transistors 170-176. If the first output of register 160 is a positive voltage, transistor 170 turns on and connects capacitor 162 to ground. Capacitor 162 would be selected as part of capacitor bank 130. If the second output of register 160 is a positive voltage, transistor 172 turns on and connects capacitor 164 to ground. Capacitor 164 would be selected as part of capacitor bank 130. If the third output of register 160 is a positive voltage, transistor 174 turns on and connects capacitor 166 to ground. Capacitor 166 would be selected as part of capacitor bank 130. If the fourth output of register 160 is a positive voltage, transistor 176 turns on and connects capacitor 168 to ground. Capacitor 168 would be selected as part of capacitor bank 130.

Capacitors 162-168 may each have the same value or may have different values. The values of capacitors 162-168 and the selection of which capacitors to connect to ground through the respective transistor 170-176 determines the effective capacitance of capacitor bank 130. For example, if capacitor 162 is 10.0 picofarads (pf) and capacitor 164 is 10.0 pf, then turning on transistors 170 and 172 would provide 20.0 pf for capacitor bank 130. The selection of values for capacitor bank 130 can be done by observing driver 116 operational dynamics, such as bit error rate, or by observing the waveforms in FIGS. 5-6.

Figure 5:
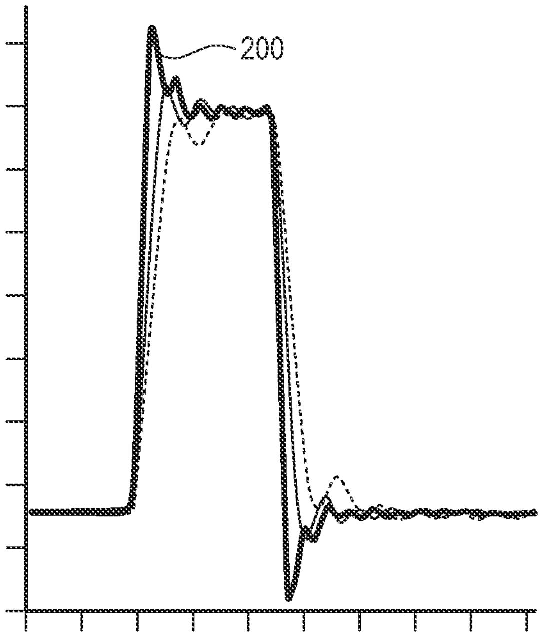
FIG. 5 illustrates waveform plots of capacitive loading altered on all four stages.
Figure 6:
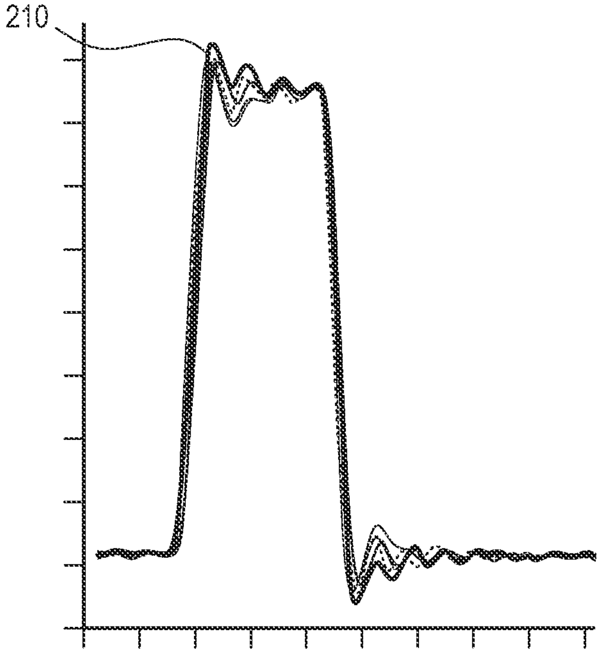
FIG. 6 illustrates waveform plots of capacitive loading altered on each of the four stages.

Programmable capacitors 130 facilitate a wide range of response shaping. Example differential voltage response shaping over time is shown in FIGS. 5 and 6. Lowering all stage loading in the same manner would result in a sharper emphasized response as shown in FIG. 5, while increasing the segment loading reduces the impedance and would result in a de-emphasized response that effectively slows down the response. The responses in FIG. 5 show the impact of a +/−50% increase in capacitance loading from the ideal on the example 4-stage driver, FIGS. 2-3. Adjusting the stage loading individually reduces the impact and facilitates a finer adjustment of the driver response. The responses derived from the +/−50% increase in capacitance loading, of each of the four individual stages, from the ideal, is shown in FIG. 6. The independent programmability of each stage in the driver facilitates a wide range of combinations that offers multiple response shaping options to best suit the end application. In this example, the magnitude and timing of the reflections, evident in the driver response, are influenced by the programmable segment load capacitance.

The stage tuning can help or replace existing TX side filtering (such as post-tap de-emphasis or pre-emphasis) and RX side filtering, such as forward feed equalizer (FFE). One benefit of this approach is that the settled TX output voltage value is not impacted by this shaping. This compares well to traditional post-tap de-emphasis where the settled TX output voltage is decreased with de-emphasis enabled. This new approach offers potential power consumption savings.

It should be noted that the segment delay in equation (2) also changes with the load capacitance. Care should be taken that this change should not be so significant to result in response degradation because the input and out transmission line segment delays are grossly mismatched. The corresponding input line segment delay can be adjusted in the same manner as the output line segment so that their delays track. In the design contained in the present invention, the change in the output delay segment was not so significant to cause a noticeable degradation in the output response. The desired response or shape can also be obtained by tuning the load RT.

An unmatched RT would generate reflections that can result in a sharper response for lower RT and a slower response for a larger RT. This does impact the driver output swing so more, or less, current may need to be delivered to the driver stages to compensate for the adjusted driver output voltage.

While one or more embodiments of the present invention have been illustrated in detail, the skilled artisan will appreciate that modifications and adaptations to those embodiments may be made without departing from the scope of the present invention as set forth in the following claims.

What is claimed:

1. A multi-stage driver circuit, comprising:

a first transmission line including an input receiving a data signal and further including a plurality of first inductive elements and a plurality of non-programmable capacitive elements;

a second transmission line including an output for the data signal and further including a plurality of second inductive elements and a plurality of programmable capacitive elements;

a multi-stage distributed differential amplifier including a first input coupled to a first one of the plurality of first inductive elements and further coupled to a first one of the plurality of non-programmable capacitive elements and a second input of the multi-stage distributed differential amplifier coupled to a second one of the plurality of first inductive elements and further coupled to a second one of the plurality of non-programmable capacitive elements and a first output of the multi-stage distributed differential amplifier coupled to a first one of the plurality of second inductive elements and further coupled to a first one of the plurality of programmable capacitive elements and a second output of the multi-stage distributed differential amplifier coupled to a second one of the plurality of second inductive elements and further to a second one of the plurality of programmable capacitive elements, wherein a first inductive element of the plurality of second inductive elements is coupled between a first node and a second node of the second transmission line, and a first capacitive element of the plurality of programmable capacitive elements is coupled between the first node and a power supply conductor; and a control circuit coupled to the programmable capacitive elements, wherein the control circuit independently controls each of the programmable capacitive elements to selectively shape the data signal from operational dynamics of the multi-stage driver circuit.

2. The multi-stage driver circuit of claim 1, wherein a first inductive element of the plurality of first inductive elements is coupled between a first node and a second node of the first transmission line, and a first capacitive element of the plurality of non-programmable capacitive elements is coupled between the first node and a power supply conductor.

3. The multi-stage driver circuit of claim 1, wherein the programmable capacitive elements include:

a first capacitor comprising a first terminal coupled to a first power supply conductor; and a first transistor comprising a first conduction terminal coupled to a second terminal of the first capacitor, and a second conduction terminal coupled to a second power supply conductor.

4. The multi-stage driver circuit of claim 3, wherein the control circuit further includes a register comprising a first output coupled to a control terminal of the first transistor.

5. The multi-stage driver circuit of claim 1, wherein selectively shaping the data signal includes lowering stage loading of the programmable capacitive elements to sharpen a response and increasing the segment loading to reduce impedance of the programmable capacitive elements to slow the response.

6. A multi-stage driver circuit, comprising:

a first transmission line including an input receiving the data signal and further including a plurality of first inductive elements and a plurality of non-programmable capacitive elements;

a second transmission line coupled to an output of the multi-stage driver circuit, the second transmission line including a plurality of second inductive elements and a plurality of programmable capacitive elements selected to shape a data signal;

a multi-stage distributed amplifier coupled between the first transmission line and second transmission line, wherein the multi-stage distributed amplifier includes a differential amplifier including a first input coupled to a first one of the plurality of first inductive elements and further coupled to a first one of the plurality of non-programmable capacitive elements and a second input of the differential amplifier coupled to a second one of the plurality of first inductive elements and further coupled to a second one of the plurality of non-programmable capacitive elements and a first output of the differential amplifier coupled to a first one of the plurality of second inductive elements and further coupled to a first one of the plurality of programmable capacitive elements and a second output of the differential amplifier coupled to a second one of the plurality of second inductive elements and further to a second one of the plurality of programmable capacitive elements, wherein the programmable capacitive elements include, (a) a first capacitor comprising a first terminal coupled to a first power supply conductor, and (b) a first transistor coupled in series with the first capacitor to enable and disable the first capacitor in response to a control signal; and a control circuit coupled to the programmable capacitive elements, wherein the control circuit independently controls each of the programmable capacitive elements to shape the data signal.

7. The multi-stage driver circuit of claim 6, wherein a first inductive element of the plurality of second inductive elements is coupled between a first node and a second node of the second transmission line, and a first programmable capacitive element of the plurality of programmable capacitive elements is coupled between the first node and a power supply conductor.

8. The multi-stage driver circuit of claim 6, wherein a first inductive element of the plurality of first inductive elements is coupled between a first node and a second node of the first transmission line, and a first capacitive element of the plurality of non-programmable capacitive elements is coupled between the first node and a power supply conductor.

9. The multi-stage driver circuit of claim 6, wherein the first transistor comprises a first conduction terminal coupled to a second terminal of the first capacitor, and a second conduction terminal coupled to a second power supply conductor.

10. The multi-stage driver circuit of claim 9, wherein the control circuit further includes a register comprising a first output coupled to a control terminal of the first transistor.

11. The multi-stage driver circuit of claim 6, wherein the programmable capacitive elements are selected to shape the transmitted data signal from operational dynamics of the multi-stage driver circuit.

12. The multi-stage driver circuit of claim 6, wherein shaping the data signal includes lowering stage loading of the programmable capacitive elements to sharpen a response and increasing the segment loading to reduce impedance of the programmable capacitive elements to slow the response.

13. A method of shaping a data signal in a multi-stage driver circuit, comprising:

providing a first transmission line including an input receiving the data signal and further including a plurality of first inductive elements and a plurality of non-programmable capacitive elements;

providing a second transmission line coupled to an output of the multi-stage driver circuit, the second transmission line including a plurality of first inductive elements and a plurality of programmable capacitive elements;

providing a multi-stage distributed amplifier coupled between the first transmission line and second transmission line, wherein the multi-stage distributed amplifier includes a differential amplifier including a first input coupled to a first one of the plurality of first inductive elements and further coupled to a first one of the plurality of non-programmable capacitive elements and a second input of the differential amplifier coupled to a second one of the plurality of first inductive elements and further coupled to a second one of the plurality of first capacitive elements and a first output of the differential amplifier coupled to a first one of the plurality of second inductive elements and further coupled to a first one of the plurality of programmable capacitive elements and a second output of the differential amplifier coupled to a second one of the plurality of second inductive elements and further to a second one of the plurality of programmable capacitive elements, wherein the programmable capacitive elements include, (a) providing a first capacitor comprising a first terminal coupled to a first power supply conductor, and (b) providing a first transistor coupled in series with the first capacitor to enable and disable the first capacitor in response to a control signal; and independently controlling the programmable capacitive elements by selecting values for the programmable capacitive elements to shape the data signal.

14. The method of claim 13, wherein a first inductive element of the plurality of second inductive elements is coupled between a first node and a second node of the second transmission line, and a first programmable capacitive element of the plurality of programmable capacitive elements is coupled between the first node and a power supply conductor.

15. The method of claim 13, wherein a first inductive element of the plurality of first inductive elements is coupled between a first node and a second node of the first transmission line, and a first capacitive element of the plurality of non-programmable capacitive elements is coupled between the first node and a power supply conductor.

16. The method of claim 13, wherein the first transistor comprises a first conduction terminal coupled to a second terminal of the first capacitor, and a second conduction terminal coupled to a second power supply conductor.

17. The method of claim 16, further including providing a control circuit to independently control each of the programmable capacitive elements to shape the data signal, wherein providing the control circuit further includes providing a register comprising a first output coupled to a control terminal of the first transistor.

18. The method of claim 13, wherein independently controlling the programmable capacitive elements selects values for the programmable capacitive elements to shape the data signal from operational dynamics of the multi-stage driver circuit.

19. The method of claim 13, wherein shaping the data signal includes lowering stage loading of the programmable capacitive elements to sharpen a response and increasing the segment loading to reduce impedance of the programmable capacitive elements to slow the response.

* * * * *